United States Patent [19]
Kobayashi

[11] Patent Number: 5,909,626
[45] Date of Patent: Jun. 1, 1999

[54] SOI SUBSTRATE AND FABRICATION PROCESS THEREFOR

[75] Inventor: Kenya Kobayashi, Tokyo, Japan

[73] Assignee: NEC Corporation, Tokyo, Japan

[21] Appl. No.: 08/826,046

[22] Filed: Mar. 28, 1997

[51] Int. Cl.$^6$ .................................................. H01L 21/76
[52] U.S. Cl. ...................... 438/406; 438/404; 438/405; 438/413; 438/977; 148/33.3
[58] Field of Search .................... 438/404, 405, 438/406, 413, 977; 148/33.3

[56] References Cited

U.S. PATENT DOCUMENTS

| | | | |
|---|---|---|---|
| 5,356,827 | 10/1994 | Ohika | 438/405 |
| 5,476,809 | 12/1995 | Kobayashi | 438/405 |
| 5,529,947 | 6/1996 | Okonogi | 438/405 |
| 5,573,972 | 11/1996 | Kobayashi | 438/405 |
| 5,688,702 | 11/1997 | Nakagawa et al. | 438/406 |

FOREIGN PATENT DOCUMENTS 4-29353  1/1992  Japan .

OTHER PUBLICATIONS

Nakagawa et al., "500VC Three Phase Inverter ICs Based on a New Dielectric Isolation Technique", Proceedings of 1992 International Symposium on Power Semiconductor Devices & ICs, pp. 328–332.

Primary Examiner—Trung Dang
Attorney, Agent, or Firm—Foley & Lardner

[57] ABSTRACT

After partially burying an insulation layer in a first single-crystalline silicon substrate, and flattening, the first single-crystalline silicon substrate and a second single-crystalline substrate are formed with a low impurity concentration epitaxial layer. By grinding and polishing the first single crystalline silicon substrate, an ultra thin film SOI layer having thickness of about 0.1 $\mu$m is formed. On the ultra thin film SOI layer, an insulation layer 8 for isolation is formed. Thus, an SOI substrate for integrating the power element and a control circuit element including the ultra thin film SOI layer in one chip can be provided.

14 Claims, 6 Drawing Sheets

SOI SUBSTRATE AND FABRICATION PROCESS THEREFOR

BACKGROUND OF THE INVENTION

1. Field of the Invention

The present invention relates generally to an SOI substrate and a fabrication process therefor. More specifically, the invention relates to an SOI substrate suitable for a power IC, in which a power element and a control circuit element including an ultra thin film SOI element are integrated on a single chip.

2. Description of the Related Art

When a high-power element having a current path from a surface to a backside surface of a silicon substrate and a control circuit consisting of low tolerance voltage power element are integrated on a single chip, an SOI substrate, in which the control circuit can be formed in an SOI layer isolated from a power element forming region, is employed. This type of SOI substrate has been known from Japanese Unexamined Patent Publication (Kokai) No. Heisei 4-29353 and Proceedings of 1992 ISPSD.

FIGS. 1A to 1F are sections showing steps in sequential order of a fabrication process of the SOI substrate for integrating a vertical type power element and the control circuit, as disclosed in the above-identified Japanese Unexamined Patent Publication No. Heisei 4-29353 (hereinafter referred to as "first prior art").

At first, as shown in FIG. 1A, a patterning is performed for a main surface of a first silicon substrate (N⁻type) 1 by way of a photolithographic method, and a shallow step 2 is formed by ion etching or other appropriate methods using a photoresist as a mask.

Then, as shown in FIG. 1B, after forming an insulation layer of $SiO_2$ by way of thermal oxidation or other appropriate methods, a projecting portion of the insulation layer projecting beyond the main surface of the substrate is removed by polishing, etching or other applicable method so that the exposed surface of the first silicon substrate (N⁻type) 1 and the surface of the buried insulation layer 3 lie flush (on the same plane).

Subsequently, as shown in FIG. 1C, the main surface of the first silicon substrate (N⁻type) 1, in which the buried insulation layer 3 is formed, is bonded with a main surface of a second silicon substrate (N⁺-type) 4. Then, heat treatment is performed to form a firmly bonded single composite substrate.

Thereafter, the first silicon substrate (N⁻type) 1 is ground and polished into a desired thickness. In conjunction therewith, planarization is effected to form an SOI layer 9.

As shown in FIG. 1E, on the planar surface of the SOI layer 9 formed through the planarization, an insulation layer is formed. Then, the insulation layer is patterned by photolithographic method. Using the insulation layer as a mask, alkali-etching is performed to form cross-sectionally triangular isolation grooves 10 for isolating elements.

Thereafter, as shown in FIG. 1F, an insulation layer is formed on the surface of the first silicon substrate (N⁻type) 1 by thermal oxidation or other applicable method. Then, by way of CVD method or epitaxial method, a polycrystalline silicon layer is formed. Then, the polycrystalline silicon layer and the insulation layer are polished to form insulation layers 11 on tapered side walls of the isolation grooves 10, and polycrystalline silicon layers 12 buried in the isolation grooves 10. Through the sequence of process set forth above, the SOI substrate, in which the element forming regions are isolated by dielectric body, can be obtained.

FIGS. 2A to 2D are sections showing sequential order of process steps of a fabrication process of an SOI substrate adapted for integrating horizontal-type power elements and control circuit as disclosed in the above-identified Proceedings of 1992 ISPSD (hereinafter referred to as "second prior art").

At first, as shown in FIG. 2A, after forming an insulation layer 103 on one main surface of a first silicon substrate (P⁻type) 101 by thermal oxidation, the one main surface is bonded with one main surface of a second silicon substrate (any impurity concentration and conductivity type) 102. Then, heat treatment is performed to form a single composite substrate, in which the first and second silicon substrates are firmly bonded.

Then, as shown in FIG. 2B, the surface of the first silicon substrate (P⁻type) 101 is ground and polished into a desired thickness. In conjunction therewith, planarization is performed to obtain the SOI layer 9.

Subsequently, applying the similar processes to those of the steps of FIGS. 1E and 1F, the SOI substrate, in which the element forming regions are isolated by dielectric body, is formed as shown in FIGS. 2c and 2D.

In case of a power IC, in which the high tolerance voltage power element and the control circuit constructed with the low tolerance voltage element are integrated into a single chip, if an ultra thin film SOI element having property of high speed operation, lower power consumption, high reliability and so forth, is integrated, it becomes necessary to completely deplete the SOI layer in order to attain high speed in operation of the ultra thin film SOI element. A thickness of the SOI layer is required in the range of 0.1 μm. The design rule for achieving higher package density associated with reduction of the element dimension always requires a precision of ±10% in each dimension, ±10% of precision is similarly required for the thickness of the SOI substrate When the thickness of the SOI layer is set at 0.1 μm for integrating the ultra thin film SOI element in the power IC, in the first prior art, the thickness of the low concentration region of the vertical-type power element forming region (FIG. 1F) becomes thinner simultaneously. In the normal case, the vertical-type power element requires several tens to several hundreds volts of tolerance. For satisfying such tolerance voltage, a thickness of the low concentration region, several to several tens μm is required. Accordingly, in the conventional SOI substrate it has been difficult to form the ultra thin film SOI element for high speed operation and the power element having sufficiently high tolerance voltage, on the common substrate.

Similarly, the horizontal type power element is also required the tolerance voltage of several tens to several hundreds volts. Thus, approximately 1 μm of thickness becomes required for the SOI layer in the region for forming such power elements. However, in the SOI substrate of the second prior art, the SOI layer in the horizontal-type power element forming region should have a thickness of approximately 0.1 μm similarly to the ultra thin film SOI layer. Therefore, it is not possible to form the ultra thin film SOI element operable to high speed and the horizontal-type power element having sufficient high tolerance voltage on the common substrates.

Also, in the second prior art, the thickness of the horizontal-type power element forming region (FIG. 2D) becomes 0.1 μm. Therefore, the power element with sufficient performance cannot be fabricated in the conventional fabrication process.

SUMMARY OF THE INVENTION

Therefore, it is an object of the present invention to provide an SOI substrate, in which an ultra thin film SOI element can be integrated in a power IC, and a fabrication process therefore.

Another object of the present invention is to provide the SOI substrate, in which the power element having sufficiently high tolerance voltage power element and the ultra thin film SOI element permitting high speed operation can be integrated on a single chip with avoiding mutual affect during operation, and a fabrication process therefor.

A further object of the present invention is to the SOI substrate which can integrate a vertical-type power element and can be adapted to wide range of tolerance voltage of the power element, and a fabrication process therefor.

A still further object of the present invention is to provide the SOI substrate which can improve layer thickness controllability of the ultra thin film SOI layer and can integrate a power element with high tolerance voltage, and a fabrication process therefor.

A yet further object of the present invention is to provide the SOI substrate which can provide sufficiently high bonding ability even when a planarization process for flattening a surface, in which a single-crystalline silicon and an insulation layer are admixingly present.

An SOI substrate according to the present invention, may comprise:

a first single-crystalline silicon substrate, including:
   a first insulation layer partially buried on one surface to be bonded of said single-crystalline silicon substrate;
   a ultra thin film SOI layer formed on another surface of said single-crystalline silicon substrate at the opposite side to said one surface to be bonded; and
   a second insulation layer formed from the surface of said ultra thin film SOI layer in a depth reaching said first insulation layer; and
a second single-crystalline silicon substrate to be bonded onto said one surface of said first single-crystalline silicon substrate said second single-crystalline silicon substrate including:
   a single-crystalline silicon epitaxial layer of low impurity concentration on one surface to be bonded.

An SOI substrate according to another aspect of the invention, may comprise:

a first single-crystalline silicon substrate, including:
   a first insulation layer partially buried on one surface to be bonded of said single-crystalline silicon substrate;
   an SOI layer formed on another surface of said single-crystalline silicon substrate at the opposite side to said one surface to be bonded;
   a dielectric isolation region formed from the surface of said SOI layer in a depth reaching said first insulation layer;
   a third insulation layer formed on the surface of said SOI layer surrounded by at least one dielectric isolation region; and
   a ultra thin film SOI layer formed between said third insulation layer and said SOI layer; and
a second single-crystalline silicon substrate to be bonded onto said one surface of said first single-crystalline silicon substrate.

An SOI substrate according to another aspect of the invention, may comprise:

a first single-crystalline silicon substrate, including:
   a first insulation layer buried on entire surface of one surface to be bonded of said single-crystalline silicon substrates
   an SOI layer formed on another surface of said single-crystalline silicon substrate at the opposite side to said one surface to be bonded;
   a dielectric isolation region formed from the surface of said SOI layer in a depth reaching said first insulation layer;
   a third insulation layer formed on the surface of said SOI layer surrounded by at least one dielectric isolation region; and
   a ultra thin film SOI layer formed between said third insulation layer and said SOI layer; and
a second single-crystalline silicon substrate to be bonded onto said one surface of said first single-crystalline silicon substrate.

An SOI substrate according to still further aspect of the invention, may comprise:

a first single-crystalline silicon substrate, including:
   an SOI layers formed on another surface of said single-crystalline silicon substrate at the opposite side to one surface to be bonded;
   a plurality of dielectric isolation regions formed from the surface of said SOI layer in a depth reaching said first insulation layer;
   a third insulation layer formed on the surface of said SOI layer surrounded by at least one of dielectric isolation regions; and
   a ultra thin film SOI layer formed between said third insulation layer and said SOI layer; and
a second single-crystalline silicon substrate to be bonded onto said one surface of said first single-crystalline silicon substrate, said second single-crystalline silicon substrate including:
   first insulation layer formed over entire surface of one surface to be bonded of said second single-crystalline silicon substrate.

A fabrication process of an SOI substrate according to the invention, may comprise the steps of:

forming a first insulation layer partially buried in one main surface of a first single-crystalline silicon substrate;

flattening the surface of said single-crystalline silicon substrate and the surface of said first insulation layer on said one main surface of said first single-crystalline silicon substrate, so that both surface lies in flush;

performing epitaxial growth of a single-crystalline silicon layer on a main surface of a second single-crystalline silicon substrate, said single-crystalline silicon layer having lower impurity concentration than that of said second single-crystalline silicon substrate;

bonding said first single-crystalline silicon substrate and said second single-crystalline silicon substrate with mating said first insulation layer and said epitaxially grown single-crystalline silicon layer and performing heat treatment for integrating both substrates;

forming a ultra thin film SOI layer by polishing the other main surface of said first single-crystalline silicon substrate; and forming a second insulation layer reaching said first insulation layer in said ultra thin film SOI layer.

A fabrication process of an SOI substrate according to the another aspect of the invention, may comprise the steps of:

forming a first insulation layer partially buried in one main surface of a first single-crystalline silicon substrate;

flattening the surface of said single-crystalline silicon substrate and the surface of said first insulation layer on said one main surface of said first single-crystalline silicon substrate, so that both surface lies in flush;

bonding the flattened surface and one main surface of a second single-crystalline silicon substrate and performing heat treatment for integrating both substrates;

polishing one of the other main surface of said first and second single-crystalline silicon substrates to form an SOI layer contacting with said first insulation layer;

forming isolation groove in said SOI layer in a depth reaching said first insulation layer;

forming a second insulation layer on inner wall of said isolation groove;

burying a dielectric material within said isolation groove formed with said second insulation layer to form a dielectric isolation region; and forming a third insulation layer and a ultra-thin film SOI layer below said third insulation layer by performing oxygen ion implantation and heat treatment for said SOI layer surrounded by said dielectric isolation region.

A fabrication process of an SOI substrate according to another aspect of the invention, may comprise the steps of:

forming a first insulation layer on one main surface of a first single-crystalline silicon substrate;

flattening the surface of said one main surface of said single-crystalline silicon substrate and the surface of said first insulation layer so that both surface lies in flush;

bonding the flattened surface and one main surface of a second single-crystalline silicon substrate and performing heat treatment for integrating both substrates;

polishing one of the other main surface of said first and second single-crystalline silicon substrates to form an SOI layer contacting with said first insulation layer;

forming isolation groove in a depth reaching said first insulation layer in said SOI layer;

forming a second insulation layer on inner wall of said isolation groove;

burying a dielectric material within said isolation groove formed with said second insulation layer to form a dielectric isolation region; and forming a third insulation layer and a ultra-thin film SOI layer below said third insulation layer by performing oxygen ion implantation and heat treatment for said SOI layer surrounded by said dielectric isolation region.

According to the present invention, a power element forming region and a control circuit forming region are isolated by a dielectric body. It is also possible to permit selection of the thickness of low concentration layer adapted to a form respective forming regions so that a power element with sufficiently high tolerance voltage and an ultra thin film SOI element having high speed operation do not affect each other, thereby permitting integration on a single chip.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however to those skilled in the art that the present invention may be practiced without these specific details. In other instances, well-known structures are not shown in detail in order to avoid unnecessarily obscuring the present invention.

Figure 1A:
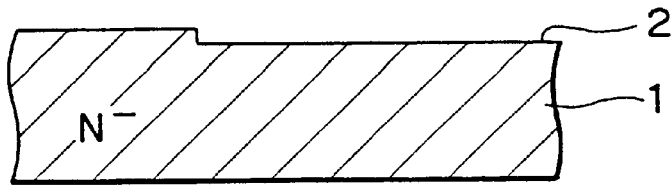
FIGS. 1A to 1F are sections showing a sequential order of steps of a fabrication process of an SOI substrate in the first prior art.
Figure 1B:
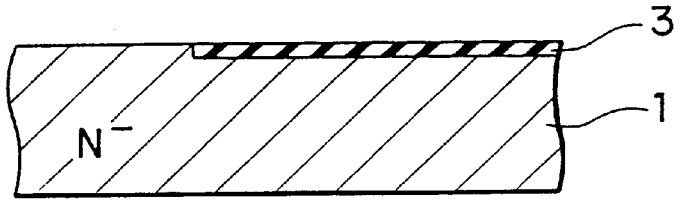
Figure 1C:
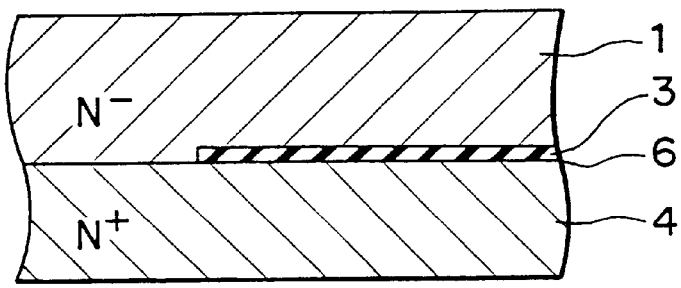
Figure 1D:
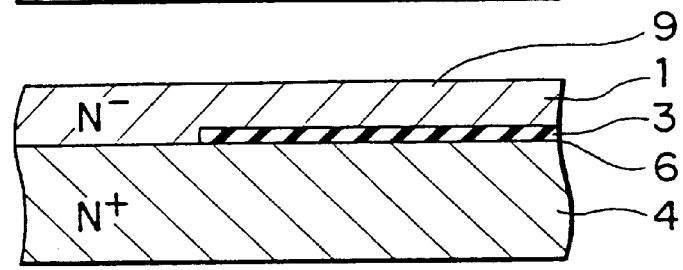
Figure 1E:
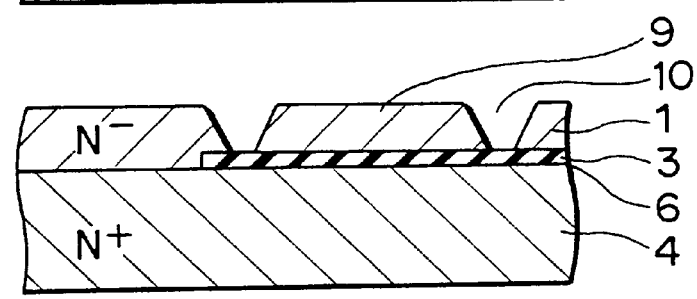
Figure 1F:
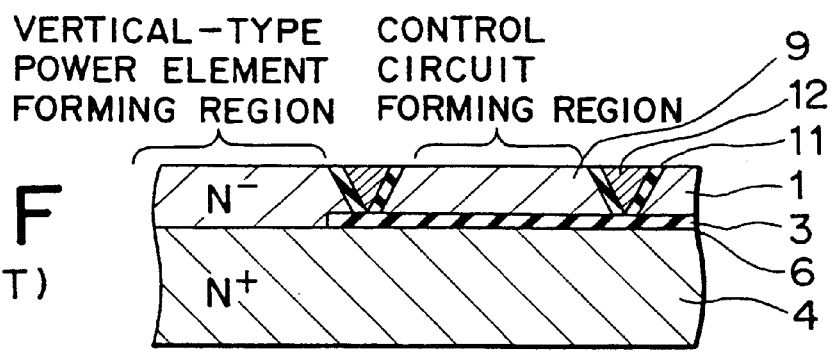
Figure 2A:
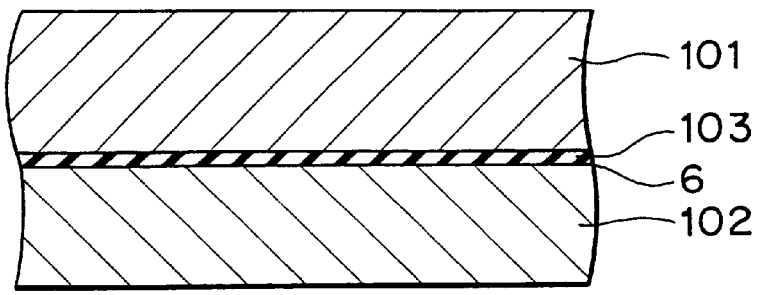
FIGS. 2A to 2D are sections showing a sequential order of steps of a fabrication process of the SOI substrate in the second prior art.
Figure 2B:
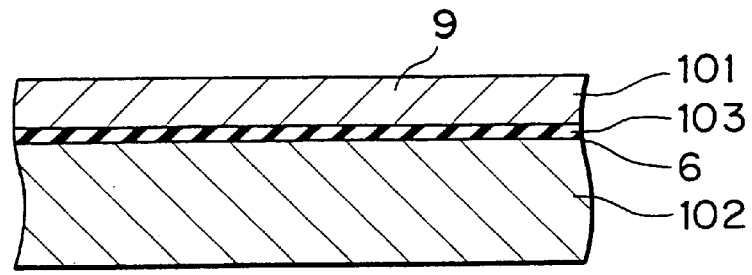
Figure 2C:
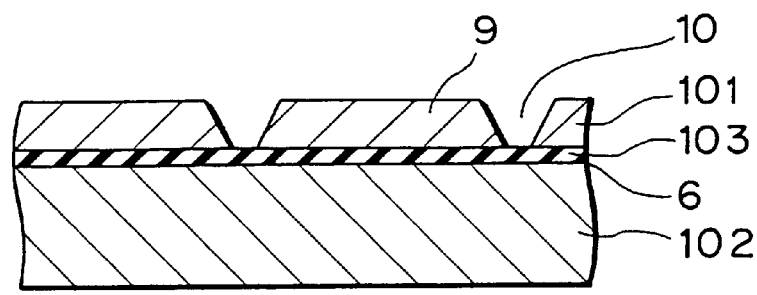
Figure 2D:
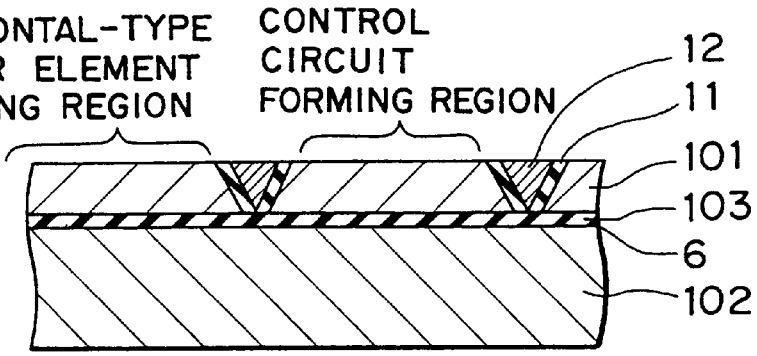
Figure 3A:
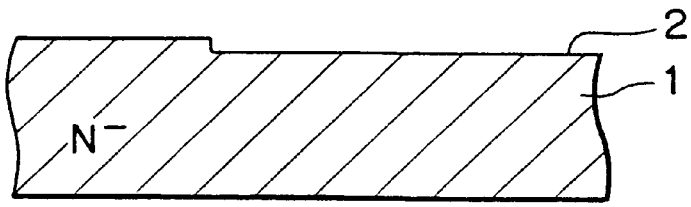
FIGS. 3A to 3E are sections showing a sequential order of steps of the first embodiment of a fabrication process of the SOI substrate according to the present invention.

FIGS. 3A to 3E are sections showing a sequential order of process steps of the first embodiment of a fabrication process of an SOI substrate according to the present invention, and a structure of the SOI substrate. At first, as shown in FIG. 3A, in order to obtain the desired characteristics of elements formed in the following process steps, a first silicon substrate (N⁻-type) 1 doped with phosphorous in a range of concentration of approximately $10^{14}$ cm$^{-3}$ to $10^{15}$ cm$^{-3}$, for example, is prepared. On one main surface of the substrate, a photolithographic method and an ion etching method are applied to form a step 2 adapting to a thickness of a buried insulation layer 3 as a first insulation layer to be formed in the next step.

Figure 3B:
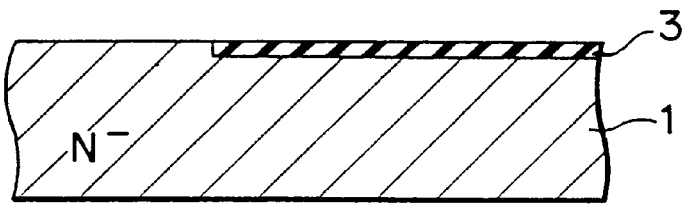

Next, as shown in FIG. 3B, after formation of the insulation layer consisted of SiO$_2$ in a thickness of several μm required for isolation, by thermal oxidation or other appropriate method, a projecting portion of the insulation layer projecting beyond the general surface of the substrate is removed by polishing or etching to form the buried insulation layer 3 having a surface lying in flush to an exposed surface of the first silicon substrate (N⁻type) 1.

Next, a second silicon substrate (N⁺-type) 4 doped with $10^{19}$ cm$^{-3}$ of antimony, for example is prepared. On one primary surface of the second silicon substrate (N⁺-type) 4, as shown in FIG. 3C, an epitaxial layer (N⁻layer) 5 doped with about $10^{14}$ cm$^{-3}$ to $10^{15}$ cm$^{-3}$ of phosphorous, is formed in a thickness necessary for obtaining demanded tolerance voltage of a vertical-type power element which will be formed through the following process.

Figure 3C:
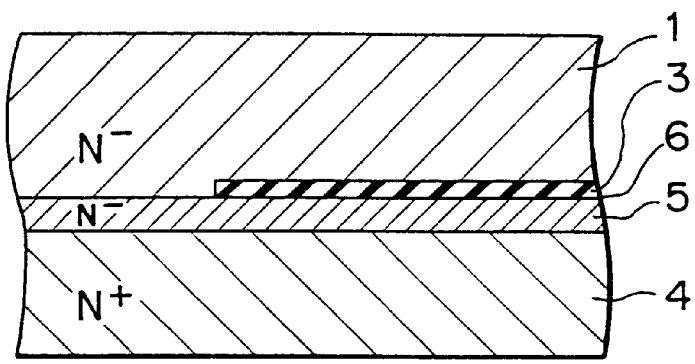

Then, as shown in FIG. 3C, the first silicon substrate 1 and the second silicon substrate 4 are bonded with mating one main surface of the first silicon substrate (N⁻type) 1 formed with the buried insulation layer 3 and the epitaxial layer (N⁻-type) 5 of the second silicon substrate 4. Next, the substrate is subjected to a heat treatment at 1100to 1200° C. for about one to two hours for firmly forming a junction between the substrates 1 and 4 to form an integrated single composite substrate.

Figure 3D:
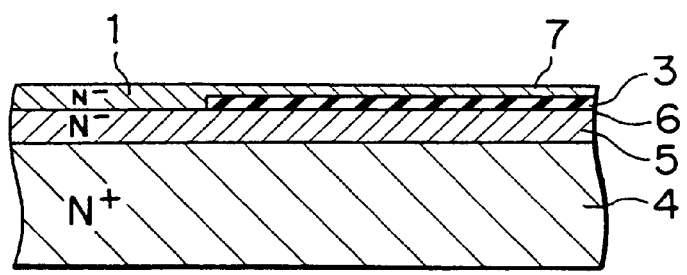

Next, as shown in FIG. 3D, the first silicon substrate (N⁻-type) 1 is ground and polished for planarization of the surfaces. In conjunction therewith, an ultra thin film SOI layer 7 in a thickness of about 0.1 μm is formed.

Figure 3E:
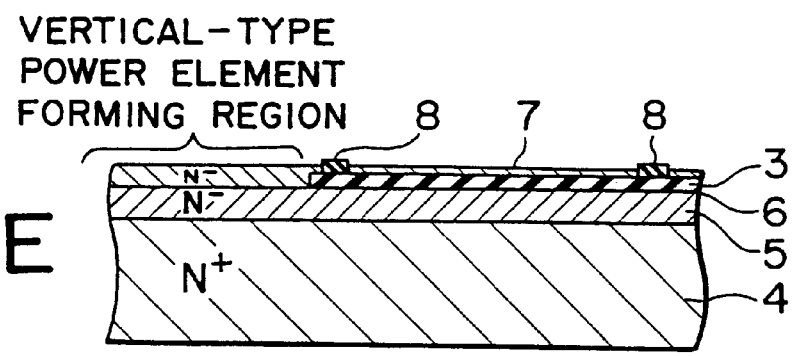

Then, as shown in FIG. 3E, on the flattened surface of the SOI layers 7, a plurality of isolating insulation layer 8 are formed in a thickness reaching the buried insulation layer 3 by LOCOS method. As set forth above, the SOI substrate, in which the element forming regions are dielectrically isolated by the insulation layer 8, can be formed.

Figure 4A:
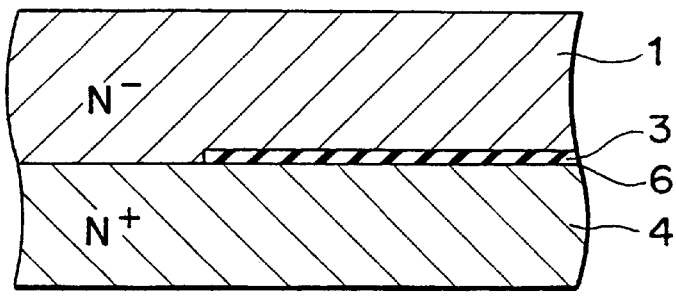
FIGS. 4A to 4E are sections showing a sequential order of steps of the second embodiment of a fabrication process of the SOI substrate according to the present invention.

FIGS. 4A to 4E show a sequential order of a second embodiment of a fabrication process of the SOI substrate according to the present invention, and the structure of the second embodiment of the SOI substrate. At first, applying the similar processes of FIGS. 3A and 3B, the first silicon substrate (N⁻type) 1 having the buried insulation layer 3 is obtained. Next, as shown in FIG. 4A, one main surface of the silicon substrate 1 and one main surface of the second silicon substrate (N⁺-type) 4 is bonded. Then, through heat treatment, a single composite substrate in which the substrates 1 and 4 are firmly coupled is obtained.

Figure 4B:
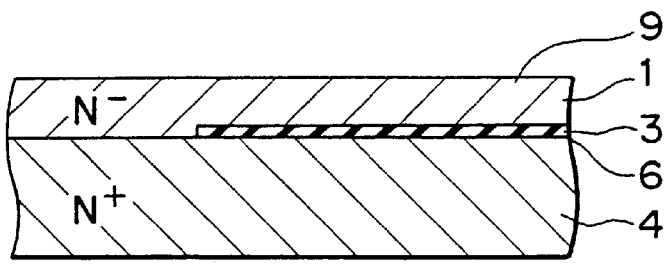

Next, as shown in FIG. 4B, the first silicon substrate (N⁻type) 1 is ground and polished to form a N⁻layer in a thickness required for obtaining desired characteristics of the vertical-type power element. Also, by flattening the surface of the N⁻layer, an SOI layer 9 is formed.

Figure 4C:
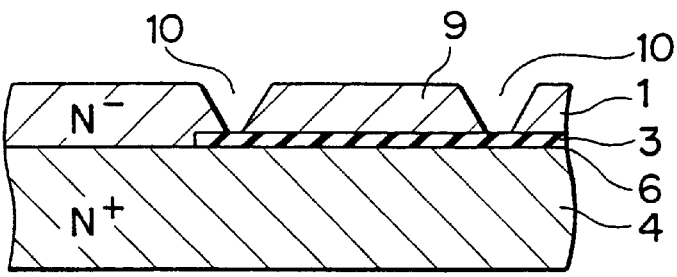

Then, as shown in FIG. 4C, a SiO₂ layer is formed on the surface of the first silicon substrate (N⁻type) 1 by way of thermal oxidation or so forth. After performing patterning by way of photolithographic method, isolation grooves 10 for isolating elements are formed byway of alkali etching, reactive ion etching (RIE) or any other applicable method. At this time, when the SOI layer 9 is relatively thin (less than or equal to 16 or 17 μm), it is desirable to select the RIE method in order to reduce the area required for isolation as much as possible.

Figure 4D:
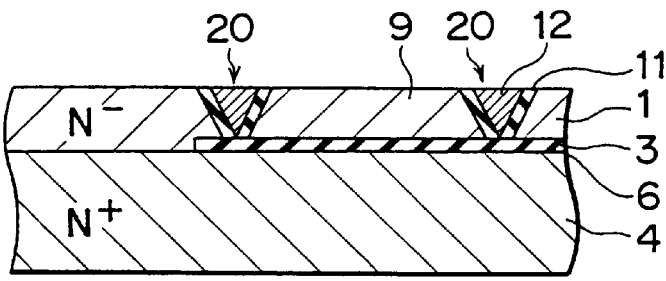

Next, as shown in FIG. 4D, over the entire surface of the first silicon substrate (N⁻type) 1, an insulation layer consisting of SIO₂ is formed by thermal oxidation or other applicable method. Then, a polycrystalline silicon layer is formed thereover by way of CVD method, epitaxial method and so forth. Then, by way of grinding and polishing, the insulation layer and the polycrystalline silicon layer on the surface of the first silicon substrate 1 are removed. Thus, dielectric isolation regions 20, in which the insulation layers 11 are formed on the side wall of the isolation groove 10 and polycrystalline silicon layer 12 is buried in the isolation groove 10, is formed.

Figure 4E:
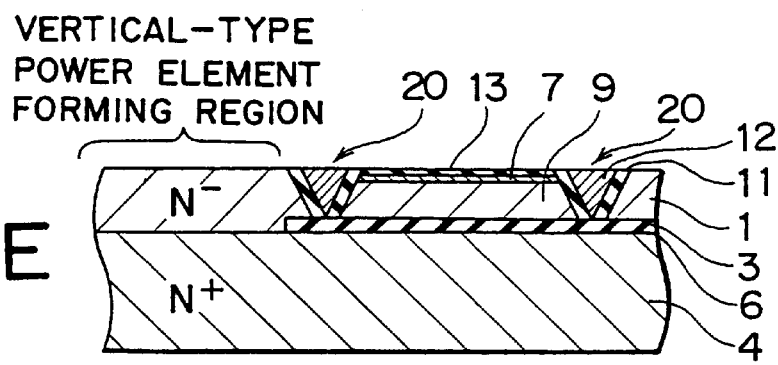

Next, as shown in FIG. 4E, an insulation layer consisted of SiO₂ is formed over the entire surface of the first silicon substrate (N⁻type) 1 by way of thermal oxidation or so forth. Then, patterning is performed by photolithographic method. Subsequently, on the surface of the SOI layer 9 surrounded by the dielectric isolation regions 20, oxygen is doped in the concentration about $10^{17}$ cm⁻³ to $10^{18}$ cm⁻³, and heat treatment is performed at 1300° C. for a several hours (SIMOX method). By this SIMOX method, the SOI substrate having a structure, in which the ultra thin film SOI layer 7 in a thickness about 0.1 μm is formed and isolated from the vertical-type element forming region by the dielectric isolation region 20, can be fabricated.

FIGS. 5A to 5E are sections showing a sequential process steps of the third embodiment of the SOI substrate fabrication process according to the present invention, and the structure of the SOI substrate formed through the third embodiment of the fabrication process. At first, by applying a similar process to those in FIGS. 3A and 3B, the first silicon substrate (N⁻type) 1 with the buried insulation layer 3 is formed.

Figure 5A:
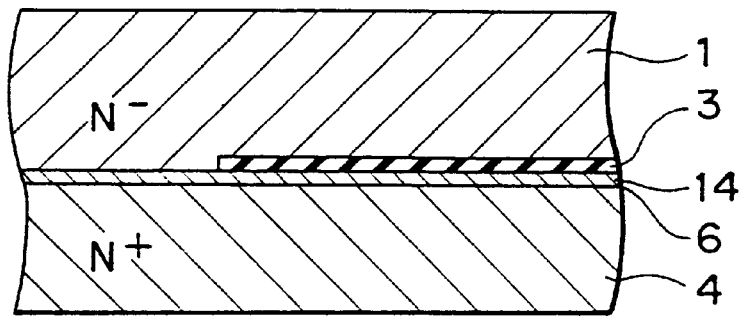
FIGS. 5A to 5E are sections showing a sequential order of steps of the third embodiment of a fabrication process of the SOI substrate according to the present invention.
Figure 5B:
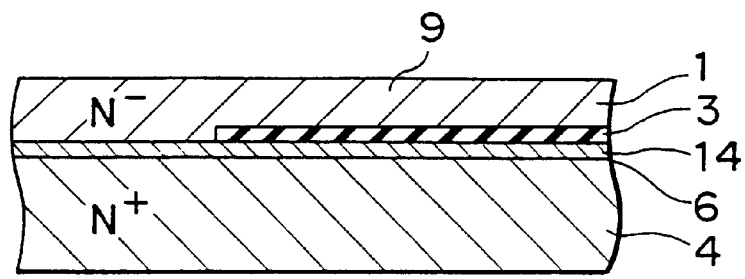
Figure 5C:
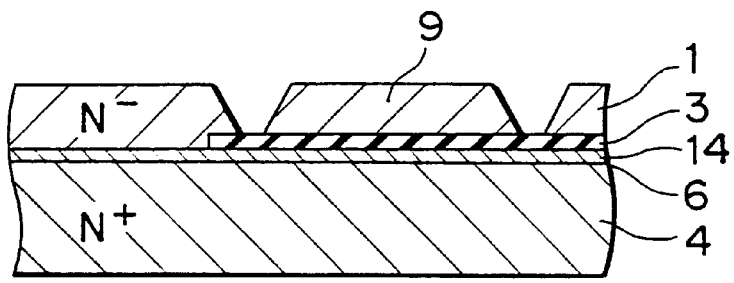
Figure 5D:
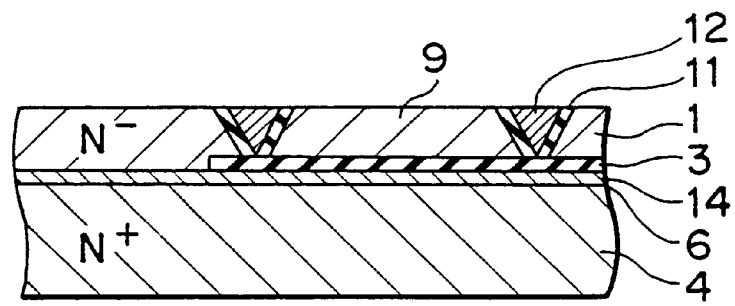

Next as shown in FIG. 5A a polycrystalline silicon layer 14 is formed on one main surface of the first silicon substrate 1 by way of CVD method or any other applicable method. The surface of the polycrystalline silicon layer 14, is polished for planarization. The flattened surface of the polycrystalline silicon layer 14 formed on the first silicon substrate (N⁻-type) 1 is mated and bonded with one main surface of the second silicon substrate (N⁺-type) 4. Then, through heat treatment, a single composite substrate is formed in which the substrates 1 and 4 are firmly coupled. At this time, the polycrystalline silicon layer 14 is formed for flattening the surface of the first silicon substrate (N⁻type) 1 with the buried insulation layer 3, and enables bonding with the second silicon substrate 4 even if the flattening polishing step of the surface of the first silicon substrate (N⁻type) 1 is neglected. Also, the polycrystalline silicon layer 14 may be doped with impurity as required to lower resistance thereof.

Figure 5E:
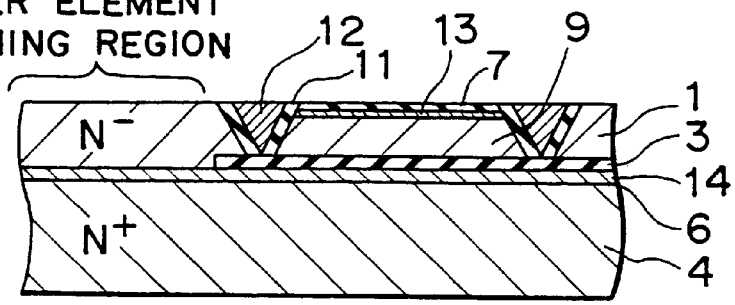

As shown in FIGS. 5B to 5E, processes similar to those in FIGS. 4B to 4E are applied. Then, as shown in FIG. 5E, the SOI substrate having the ultra thin film SOI layer 7 having thickness of about 0.1 μm and isolated from the vertical-type power element formation region by dielectric isolation, can be obtained.

Figure 6A:
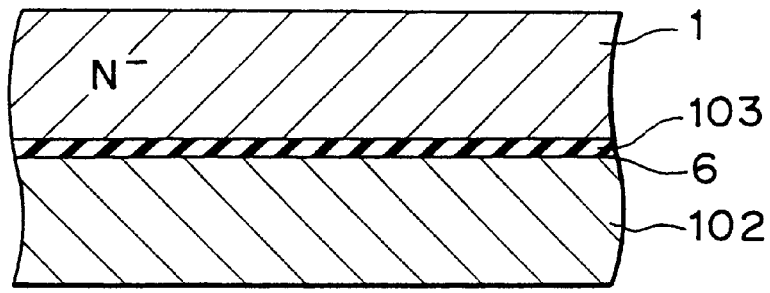
FIGS. 6A to 6E are sections showing a sequential order of steps of the fourth embodiment of a fabrication process of the SOI substrate according to the present invention.
Figure 6B:
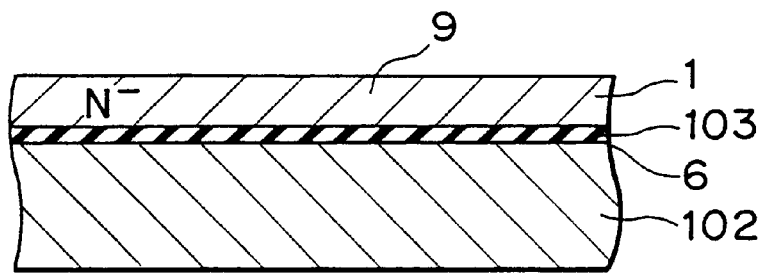
Figure 6C:
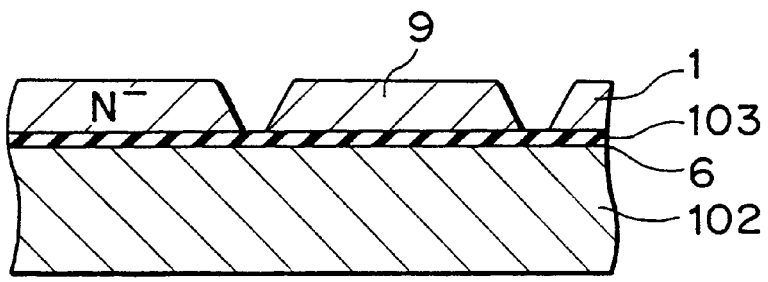
Figure 6D:
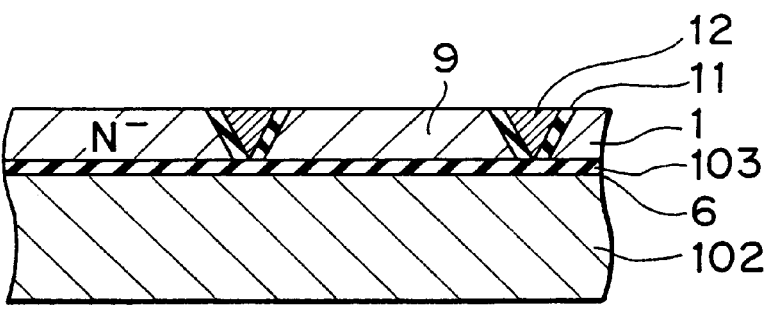
Figure 6E:
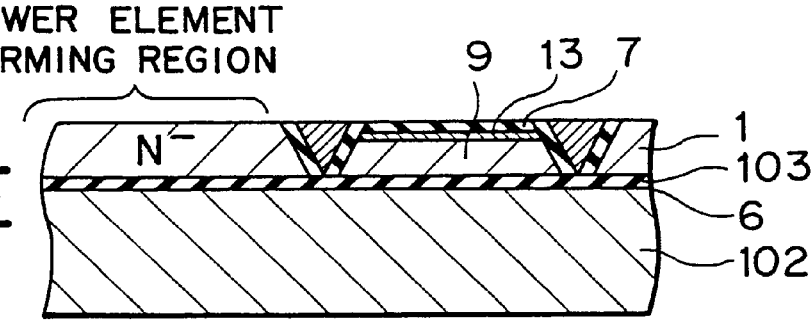

FIGS. 6A to 6E show a sequential order of process steps in the fourth embodiment of the SOI fabrication process, and the structure of the substrate therefor. At first, as shown in FIG. 6A, the insulation layer 103 is formed over the one main surface of the first silicon substrate (N⁻type) 1 by way of thermal oxidation. Then, on the surface of the insulation layer 103 formed on the first silicon substrate 1, a second silicon substrate (arbitrary impurity concentration and conductivity type) 102 is bonded. Then, through heat treatment, a single composite substrate in which the substrates 1 and 102 are firmly coupled is obtained.

Next, as shown in FIGS. 6B to 6E, similar processes to those in FIGS. 4B to 4E are applied to obtain the SOI substrate having the ultra thin film SOI layer 7 having thickness of about 0.1 μm and isolated from the horizontal-type power element formation region by dielectric isolation.

As set forth above, according to the present invention, as shown in FIGS. 3A to 3E, 4A to 4E, 5A to 5E and 6A to 6E, the power element forming region and the control circuit forming region are dielectrically isolated with thick insulation layer. Also, it becomes possible to select thickness of the low concentration layer adapting to respective forming regions. Therefore, the power element with sufficiently high tolerance voltage and the ultra thin film SOI element of high operation speed can be integrated on the single chip while avoiding the influence of each other.

Particularly, by laminating the silicon substrate having low impurity concentration epitaxial layer, integration of the vertical-type power element becomes possible. Also, by varying the thickness of the epitaxial layer, wide range of tolerance voltage can be provided for the power element.

Also, by forming the ultra thin film SOI layer on the SOI substrate having relatively thick SOI layer formed on the thick insulation layer having thickness of several μm by way of SIMOX method, controllability of layer thickness of the ultra thin film SOI layer can be improved. Furthermore, it becomes possible to integrate the power element with high tolerance voltage, which could not be isolated in view of the tolerance voltage by the silicon oxide layer in the thickness less than or equal to about 0.3 μm which can be formed by the SIMOX method.

Furthermore, by employing the flattened surface of the polycrystalline silicon layer as bonding surface, sufficiently high bonding ability can be attained even during the process for flattening the surface, in which the single-crystalline silicon and the insulation layer are present in admixing fashion.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the features set out in the appended claims.

What is claimed is:

1. An SOI substrate comprising:
   a first single-crystalline silicon substrate, including:
      a first insulation layer partially buried on one surface to be bonded of said single-crystalline silicon substrate;
      an ultra thin film SOI layer formed on another surface of said single-crystalline silicon substrate at the opposite side to said one surface to be bonded; and
      a second insulation layer formed from the surface of said ultra thin film SOI layer in a depth reaching said first insulation layer; and
   a second single-crystalline silicon substrate to be bonded onto said one surface of said first single-crystalline silicon substrate, said second single-crystalline silicon substrate including:
      a single-crystalline silicon epitaxial layer of low impurity concentration on one surface to be bonded.

2. An SOI substrate comprising:
   a first single-crystalline silicon substrate, including:
      a first insulation layer partially buried on one surface to be bonded of said single-crystalline silicon substrate;
      an SOI layer formed on another surface of said single-crystalline silicon substrate at the opposite side to said one surface to be bonded;
      a dielectric isolation region formed from the surface of said SOI layer in a depth reaching said first insulation layer;
      a third insulation layer formed on the surface of said SOI layer surrounded by at least one dielectric isolation region; and
      a ultra thin film SOI layer formed between said third insulation layer and said SOI layer; and
   a second single-crystalline silicon substrate to be bonded onto said one surface of said first single-crystalline silicon substrate.

3. An SOI substrate asset forth in claim 2, which further comprises a polycrystalline silicon layer covering the entire surface of one surface of said first single-crystalline silicon substrate, in which said first insulation layer is buried.

4. An SOI substrate comprising:
   a first single-crystalline silicon substrate, including:
      a first insulation layer buried on entire surface of one surface to be bonded of said single-crystalline silicon substrate;
      an SOI layer formed on another surface of said single-crystalline silicon substrate at the opposite side to said one surface to be bonded;
      a dielectric isolation region formed from the surface of said SOI layer in a depth reaching said first insulation layer;
      a third insulation layer formed on the surface of said SOI layer surrounded by at least one dielectric isolation region; and
      an ultra thin film SOI layer formed between said third insulation layer and said SOI layer; and
   a second single-crystalline silicon substrate to be bonded onto said one surface of said first single-crystalline silicon substrate.

5. An SOI substrate as set forth in claim 4, which further comprises a second insulation layer formed over the entire surface of one surface to be bonded of said second single-crystalline silicon substrate.

6. An SOI substrate comprising:
   a first single-crystalline silicon substrate, including:
      an SOI layer formed on another surface of said single-crystalline silicon substrate at the opposite side to one surface to be bonded;
      a plurality of dielectric isolation regions formed from the surface of said SOI layer in a depth reaching said first insulation layer;
      a third insulation layer formed on the surface of said SOI layer surrounded by at least one of dielectric isolation regions; and
      an ultra thin film SOI layer formed between said third insulation layer and said SOI layer; and
   a second single-crystalline silicon substrate to be bonded onto said one surface of said first single-crystalline silicon substrate, said second single-crystalline silicon substrate including:
      a first insulation layer formed over the entire surface of one surface to be bonded of said second single-crystalline silicon substrate.

7. An SOI substrate as set forth in claim 1, wherein said first and second single-crystalline silicon substrates are of the same conductivity type, said first single-crystalline silicon substrate has low impurity concentration and said second single-crystalline silicon substrate has high impurity concentration.

8. An SOI substrate as set forth in claim 2, wherein said first and second single-crystalline silicon substrates are of the same conductivity type, said first single-crystalline silicon substrate has low impurity concentration and said second single-crystalline silicon substrate has high impurity concentration.

9. An SOI substrate as set forth in claim 4, wherein said first and second single-crystalline silicon substrates are of the same conductivity type, said first single-crystalline silicon substrate has low impurity concentration and said second single-crystalline silicon substrate has high impurity concentration.

10. An SOI substrate as set forth in claim 6, wherein said first and second single-crystalline silicon substrates are of the same conductivity type, said first single-crystalline silicon substrate has low impurity concentration and said second single-crystalline silicon substrate has high impurity concentration.

11. A fabrication process of an SOI substrate comprising the steps of:
   forming a first insulation layer partially buried in one main surface of a first single-crystalline silicon substrate;
   flattening the surface of said single-crystalline silicon substrate and the surface of said first insulation layer on said one main surface of said first single-crystalline silicon substrate, so that both surfaces lies in flush;

performing epitaxial growth of a single-crystalline silicon layer on a main surface of a second single-crystalline silicon substrate, said single-crystalline silicon layer having lower impurity concentration than that of said second single-crystalline silicon substrate;

bonding said first single-crystalline silicon substrate and said second single-crystalline silicon substrate by mating said first insulation layer and said epitaxially grown single-crystalline silicon layer and performing heat treatment for integrating both substrates;

forming an ultra thin film SOI layer by polishing the other main surface of said first single-crystalline silicon substrate; and forming a second insulation layer reaching said first insulation layer in said ultra thin film SOI layer.

12. A fabrication process of an SOI substrate comprising the steps of:

forming a first insulation layer partially buried in one main surface of a first single-crystalline silicon substrate;

flattening the surface of said single-crystalline silicon substrate and the surface of said first insulation layer on said one main surface of said first single-crystalline silicon substrate, so that both surfaces lie in flush;

bonding the flattened surface and one main surface of a second single-crystalline silicon substrate and performing heat treatment for integrating both substrates;

polishing one of the other main surfaces of said first and second single-crystalline silicon substrates to form an SOI layer contacting with said first insulation layer;

forming isolation groove in said SOI layer in a depth reaching said first insulation layer;

forming a second insulation layer on an inner wall of said isolation groove;

burying a dielectric material within said isolation groove formed with said second insulation layer to form a dielectric isolation region; and forming a third insulation layer and an ultra-thin film SOI layer below said third insulation layer by performing oxygen ion implantation and heat treatment for said SOI layer surrounded by said dielectric isolation region.

13. A fabrication process of an SOI substrate as set forth in claim 12, wherein a step for forming a polycrystalline silicon layer over the flattened surface of said first single-crystalline silicon substrate buried by said first insulation layer and polishing said polycrystalline silicon layer for forming a flattened surface of said polycrystalline silicon layers, is inserted between said flattening step and said bonding step.

14. A fabrication process of an SOI substrate comprising the steps of:

forming a first insulation layer on one main surface of a first single-crystalline silicon substrate;

flattening the surface of said one main surface of said single-crystalline silicon substrate and the surface of said first insulation layer so that both surfaces lie in flush;

bonding the flattened surface and one main surface of a second single-crystalline silicon substrate and performing heat treatment for integrating both substrates;

polishing one of the other main surfaces of said first and second single-crystalline silicon substrates to form an SOI layer contacting with said first insulation layer;

forming an isolation groove in a depth reaching said first insulation layer in said SOI layer;

forming a second insulation layer on an inner wall of said isolation groove;

burying a dielectric material within said isolation groove formed with said second insulation layer to form a dielectric isolation region; and forming a third insulation layer and an ultra-thin film SOI layer below said third insulation layer by performing oxygen ion implantation and heat treatment for said SOI layer surrounded by said dielectric isolation region.

* * * * *